(12) United States Patent
Sasaki

(10) Patent No.: US 11,721,531 B2
(45) Date of Patent: Aug. 8, 2023

(54) PLASMA PROCESSING APPARATUS

(71) Applicant: TOKYO ELECTRON LIMITED, Tokyo (JP)

(72) Inventor: Ryo Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/826,483

(22) Filed: May 27, 2022

(65) Prior Publication Data

US 2022/0285137 A1   Sep. 8, 2022

Related U.S. Application Data

(63) Continuation of application No. 17/036,558, filed on Sep. 29, 2020, now Pat. No. 11,380,527.

(30) Foreign Application Priority Data

Oct. 2, 2019 (JP) .................................. 2019-182194
Aug. 28, 2020 (JP) .................................. 2020-144810

(51) Int. Cl.
*H01J 37/32* (2006.01)
*H01L 21/683* (2006.01)

(52) U.S. Cl.
CPC .. *H01J 37/32642* (2013.01); *H01J 37/32183* (2013.01); *H01L 21/6833* (2013.01)

(58) Field of Classification Search
CPC ........... H01J 37/32642; H01J 37/32697; H01J 37/32091; H01J 37/32715; H01J 37/32183; H01J 37/3211; H01J 37/32431; H01L 21/6833; H01L 21/68735; H01L 21/67069; H01L 21/67103; H01L 21/6831
See application file for complete search history.

(56) References Cited

U.S. PATENT DOCUMENTS

| 10,790,122 | B2 * | 9/2020 | Hong ................. H01J 37/32697 |
| 11,380,527 | B2 * | 7/2022 | Sasaki ................. H01L 21/6833 |
| 2012/0061351 | A1 | 3/2012 | Ohata et al. |
| 2015/0187542 | A1 | 7/2015 | Ishida |
| 2018/0350567 | A1 | 12/2018 | Sugawara et al. |

(Continued)

FOREIGN PATENT DOCUMENTS

| JP | 2012-146742 A | 8/2012 |
| JP | 2018-010992 A | 1/2018 |
| JP | 2018-206913 A | 12/2018 |

*Primary Examiner* — Haissa Philogene
(74) *Attorney, Agent, or Firm* — Weihrouch IP

(57) ABSTRACT

A plasma processing apparatus includes a substrate support having a substrate supporting portion on which a substrate is placed and a peripheral portion surrounding the substrate supporting portion, a conductive focus ring placed on the peripheral portion of the substrate support, a cover ring surrounding an outer periphery of the substrate support and formed of a dielectric material, a conductive ring placed on the cover ring, and a radio frequency power supply electrically coupled to the substrate support. A first surface on an outer peripheral portion of the focus ring and a second surface on an inner peripheral portion of the conductive ring are spaced apart from each other while facing each other. Further, the cover ring has a spacing portion that separates the focus ring from the conductive ring.

20 Claims, 8 Drawing Sheets

(56) References Cited

U.S. PATENT DOCUMENTS

| | | |
|---|---|---|
| 2020/0027705 A1 | 1/2020 | Kim et al. |
| 2020/0118796 A1* | 4/2020 | Arakelyan ........ H01J 37/32183 |
| 2020/0144036 A1* | 5/2020 | Sasaki ............... H01L 21/67109 |
| 2022/0013338 A1* | 1/2022 | Ishida ............... H01J 37/32568 |
| 2022/0037127 A1 | 2/2022 | Nakatani et al. |
| 2022/0122816 A1* | 4/2022 | Sasaki ............... H01L 21/68735 |
| 2022/0157575 A1* | 5/2022 | Kitamura .......... H01L 21/68735 |

\* cited by examiner

PLASMA PROCESSING APPARATUS

CROSS-REFERENCE TO RELATED APPLICATIONS

This application is a continuation of U.S. application Ser. No. 17/036,558 filed on Sep. 29, 2020, which claims priority under 35 USC 119 from Japanese Patent Application Nos. 2019-182194 filed on Oct. 2, 2019 and 2020-144810 filed on Aug. 28, 2020, the disclosures of which are incorporated herein in their entirety by reference, and priority is claimed to each of the foregoing.

TECHNICAL FIELD

The present disclosure relates to a plasma processing apparatus.

BACKGROUND

A plasma processing apparatus for performing substrate processing may include a focus ring and a cover ring as disclosed in, e.g., Japanese Patent Application Publication No. 2018-206913. Since a conductive focus ring is disposed to surround a periphery of a semiconductor substrate, discontinuity of a bias potential at an edge portion of the substrate is suppressed, and uniformity of plasma processing is improved. A quartz cover ring is disposed around the focus ring (also referred to as "edge ring"). An outer peripheral side surface of the focus ring is covered by the cover ring.

The cover ring made of quartz that covers the outer peripheral side surface of the focus ring may be consumed as time elapses due to a sputtering of ions of plasma. Since the cover ring is consumed particularly near the focus ring, the outer peripheral side surface of the focus ring covered by the cover ring is exposed to the plasma as the cover ring is consumed. In that case, area variation of the focus ring serving as a cathode occurs. In other words, in a state where the cover ring covers the outer peripheral side surface of the focus ring, an upper surface of the focus ring functions as the cathode. In this state, when the cover ring is consumed and the outer peripheral side surface of the focus ring is exposed, the outer peripheral side surface of the focus ring also functions as the cathode. Therefore, process variation such as occurrence of tilting at the edge of the substrate may occur due to the consumption of the cover ring. The present disclosure provides a technique for suppressing the process variation caused by the consumption of the cover ring.

SUMMARY

In accordance with an aspect of the present disclosure, there is provided a plasma processing apparatus including: a substrate support having a substrate supporting portion on which a substrate is placed and a peripheral portion surrounding the substrate supporting portion; a conductive focus ring placed on the peripheral portion of the substrate support; a cover ring surrounding an outer periphery of the substrate support and formed of a dielectric material; a conductive ring placed on the cover ring; and a radio frequency power supply electrically coupled to the substrate support. A first surface on an outer peripheral portion of the focus ring and a second surface on an inner peripheral portion of the conductive ring are spaced apart from each other while facing each other. Further, the cover ring has a spacing portion that separates the focus ring from the conductive ring.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
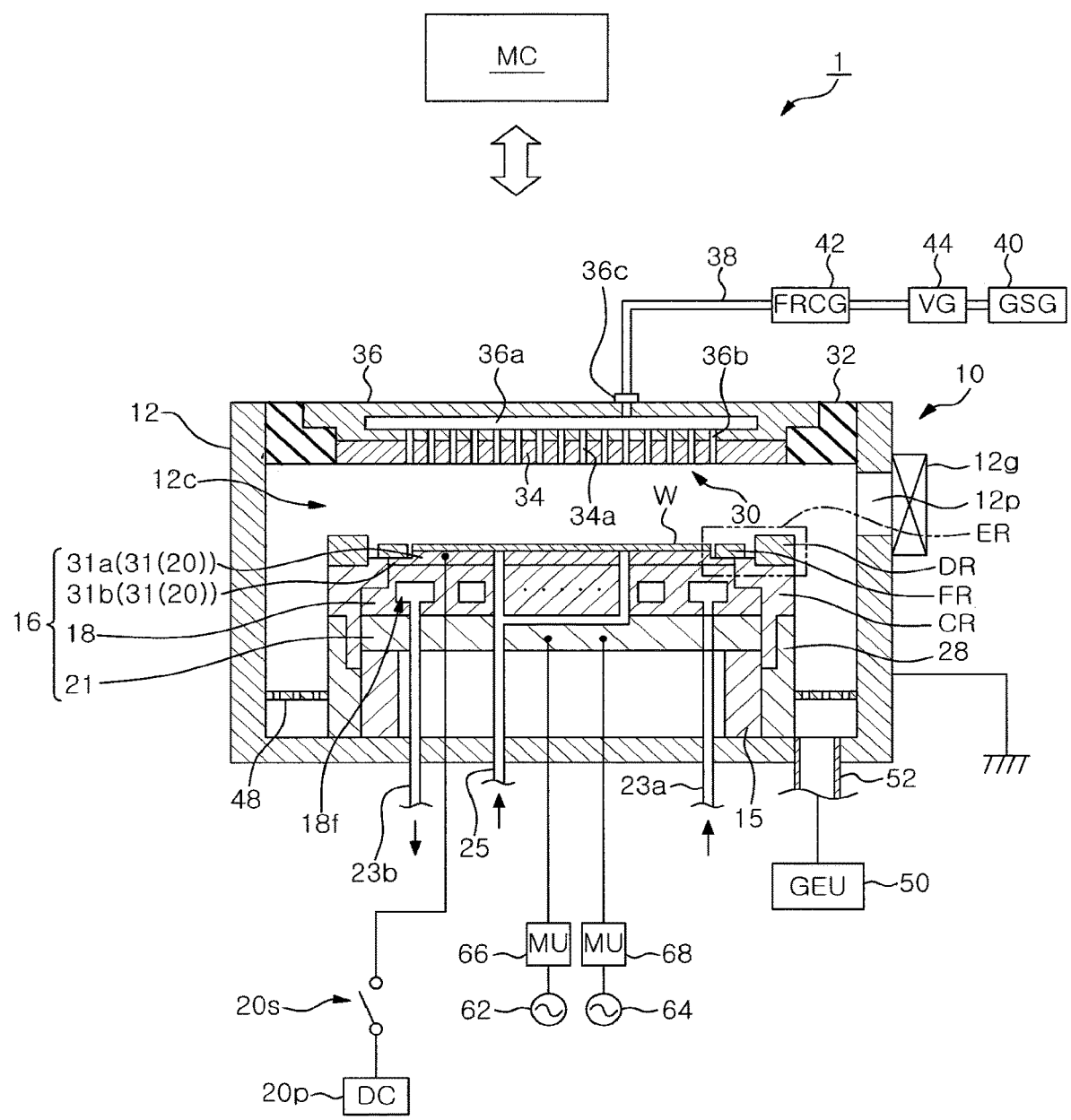
FIG. 1 shows an example of a configuration of a plasma processing apparatus according to an exemplary embodiment.

Hereinafter, various exemplary embodiments will be described.

In one exemplary embodiment, a plasma processing apparatus is provided. The plasma processing apparatus includes a substrate support, a conductive focus ring, a cover ring, a conductive ring, and a radio frequency power supply. The substrate support has a substrate supporting portion on which a substrate is placed and a peripheral portion surrounding the substrate supporting portion. The conductive focus ring is placed on the peripheral portion of the substrate support. The cover ring surrounds an outer periphery of the substrate support and is formed of a dielectric material. The conductive ring is placed on the cover ring. The radio frequency power supply is electrically coupled to the substrate support. A first surface on an outer peripheral portion of the focus ring and a second surface on an inner peripheral portion of the conductive ring are spaced apart from each other while facing each other. The cover ring has a spacing portion that separates the focus ring from the conductive ring. A first side surface of an outer periphery of the focus ring and a second side surface of an inner periphery of the conductive ring are spaced apart from each other while facing each other. The focus ring functions as a cathode during plasma processing. The conductive ring in an electrically floating state is disposed to face the outer periphery of the focus ring.

In one exemplary embodiment, an inner peripheral portion of the focus ring may be supported on the peripheral portion of the substrate support, and the outer peripheral portion of the focus ring may cover an upper surface of an inner peripheral portion of the cover ring.

In one exemplary embodiment, the first surface may be a side surface of the outer peripheral portion of the focus ring, and the second surface may be a side surface of the inner peripheral portion of the conductive ring.

In one exemplary embodiment, the first surface may be a bottom surface of the outer peripheral portion of the focus ring, and the second surface may be an upper surface of the inner peripheral portion of the conductive ring.

In one exemplary embodiment, the first surface may be an upper surface of the outer peripheral portion of the focus ring, and the second surface may be a bottom surface of the inner peripheral portion of the conductive ring.

In one exemplary embodiment, a side surface of the outer peripheral portion of the focus ring and a side surface of the inner peripheral portion of the conductive ring may be spaced apart from each other while facing each other.

In one exemplary embodiment, an area of the upper surface of the inner peripheral portion of the conductive ring facing the bottom surface of the outer peripheral portion of the focus ring may be greater than an area of the side surface of the inner peripheral portion of the conductive ring facing the side surface of the outer peripheral portion of the focus ring.

In one exemplary embodiment, a gap between the bottom surface of the outer peripheral portion of the focus ring and the upper surface of the inner peripheral portion of the conductive ring may be smaller than a gap between the side surface of the outer peripheral portion of the focus ring and the side surface of the inner peripheral portion of the conductive ring.

In one exemplary embodiment, the focus ring and the conductive ring may be capacitively coupled between the first surface and the second surface.

In one exemplary embodiment, a distance between the first surface and the second surface may be greater than zero and smaller than a thickness of the focus ring.

In one exemplary embodiment, a bottom surface of the inner peripheral portion of the conductive ring may be lower than a bottom surface of the outer peripheral portion of the focus ring.

In one exemplary embodiment, the spacing portion may be a groove portion formed on a surface of the cover ring, and a bottom surface of the inner peripheral portion of the conductive ring may be fitted in the groove portion.

In one exemplary embodiment, the spacing portion may be a stepped portion formed on a surface of the cover ring that is in contact with a side surface of the inner peripheral portion of the conductive ring.

In one exemplary embodiment, the conductive ring may be disposed on the cover ring such that an outer periphery of the conductive ring is located on an inner side compared to an outer periphery of the cover ring, and an upper surface of an outer peripheral portion of the cover ring may be exposed to a plasma processing space.

In one exemplary embodiment, the cover ring may include a plurality of dielectric parts.

In one exemplary embodiment, the substrate supporting portion and the peripheral portion may serve as an electrostatic chuck.

In one exemplary embodiment, the substrate supporting portion may serve as an electrostatic chuck, and the peripheral portion may serve as a base of the substrate support.

In one exemplary embodiment, the conductive ring may have a sloped portion between an upper surface of the conductive ring and a side surface of the inner peripheral portion of the conductive ring.

In one exemplary embodiment, the conductive ring may be formed of silicon or silicon carbide, and the cover ring may be formed of quartz.

Hereinafter, embodiments will be described in detail with reference to the accompanying drawings. Like reference numerals will be given to like or corresponding parts throughout the drawings.

The plasma processing apparatus 1 according to an exemplary embodiment includes a chamber 10. The chamber 10 has therein an inner space 12c. The chamber 10 includes a chamber body 12. The chamber body 12 has a substantially cylindrical shape. The chamber body 12 may be formed of, for example, aluminum. A corrosion resistant film is formed on an inner wall surface of the chamber body 12. The corrosion resistant film may be made of ceramic such as aluminum oxide, yttrium oxide, or the like.

The chamber body 12 has a sidewall having a port 12p. A substrate W is transferred between the inner space 12c and the outside of the chamber 10 through the port 12p. The port 12p is opened and closed by a gate valve 12g disposed on the sidewall of the chamber body 12.

A tubular portion 28 is disposed on the bottom of the chamber body 12. The tubular portion 28 may be formed of an insulating material. The tubular portion 28 has a substantially cylindrical shape. In the inner space 12c, the tubular portion 28 extends upward from the bottom of the chamber body 12.

In the inner space 12c, a support 15 extends upward from the bottom of the chamber body 12 along an inner side surface of the substantially cylindrical tubular portion 28. The support 15 has a substantially cylindrical shape. The support 15 may be formed of an insulating material such as ceramic or the like. A substrate support 16 is placed on the support 15. The substrate support 16 is supported by the support 15. The substrate support 16 is configured to support the substrate W in the inner space 12c.

The substrate support 16 is disposed on the support 15. The substrate support 16 includes a supporting portion 31, a base 18, and an electrode plate 21.

The supporting portion 31 includes a substrate supporting portion 31a on which the substrate W is placed, and a peripheral portion 31b surrounding the substrate supporting portion 31a. A focus ring FR having conductivity is placed on the peripheral portion 31b. A conductive ring DR is concentrically placed on the cover ring CR to extend along an outer periphery OPc of the focus ring FR. The supporting portion 31 may serve as an electrostatic chuck 20.

The cover ring CR is disposed on the tubular portion 28. The cover ring CR is an insulator and extends along an outer periphery of the substrate support 16. The cover ring CR is disposed to surround an outer periphery of the supporting portion 31 when viewed from a position above the supporting portion 31 (when viewed from an upper electrode 30 side). The cover ring CR is formed of an insulating material, for example, quartz or ceramic such as alumina or the like. The cover ring CR may include a plurality of dielectric parts.

The conductive ring DR is disposed on the cover ring CR. The conductive ring DR is disposed to surround the focus ring FR when viewed from the position above the supporting portion 31. The conductive ring DR has a substantially annular plate shape and is formed of a conductive material, for example, silicon (Si) or silicon carbide (SiC).

The electrode plate 21 is formed of a conductive material such as aluminum and has a substantially disc shape. The base 18 is disposed on the electrode plate 21. The base 18 is formed of a conductive material such as aluminum and has a substantially disc shape. The base 18 is electrically coupled to the electrode plate 21 and functions as a lower electrode.

The electrostatic chuck 20 that is the supporting portion 31 is disposed on the base 18. The substrate W is placed on an upper surface of the electrostatic chuck 20. The electrostatic chuck 20 includes a main body and an electrode. The main body of the electrostatic chuck 20 has a substantially disc shape and is made of a dielectric. The electrode of the electrostatic chuck 20 is a film-shaped electrode and is disposed in the main body of the electrostatic chuck 20. The electrode of the electrostatic chuck 20 is connected to a direct-current (DC) power supply (DC) 20p through a switch 20s. When a voltage from the DC power supply 20p is applied to the electrode of the electrostatic chuck 20, an electrostatic attraction force is generated between the electrostatic chuck 20 and the substrate W. Due to the electrostatic attraction force thus generated, the substrate W is attracted to and held on the electrostatic chuck 20.

The focus ring FR is disposed on the peripheral portion 31b to surround an outer periphery of the substrate W placed on the substrate supporting portion 31a. The focus ring FR is provided to improve in-plane uniformity of plasma processing on the substrate W. The focus ring FR has a substantially annular plate shape and is formed of a conductive material, for example, silicon (Si) or silicon carbide (SiC).

A flow channel 18f is formed in the base 18. A heat exchange medium (e.g., coolant) is supplied from a chiller unit to the flow channel 18f through a line 23a. The chiller unit is disposed external to the chamber 10. The heat exchange medium supplied to the flow channel 18f returns to the chiller unit through a line 23b. In the plasma processing apparatus 1, a temperature of the substrate W placed on the electrostatic chuck 20 can be adjusted by heat exchange between the heat exchange medium and the base 18.

The plasma processing apparatus 1 may further include a gas supply line 25. The gas supply line 25 is provided to supply a heat transfer gas (e.g., He gas) from a heat transfer gas supply mechanism to a space between the upper surface of the electrostatic chuck 20 and a back surface of the substrate W.

The plasma processing apparatus 1 further includes an upper electrode 30. The upper electrode 30 is disposed above the substrate support 16. The upper electrode 30 is supported at an upper portion of the chamber body 12 through a member 32. The member 32 may be formed of an insulating material. The upper electrode 30 and the member 32 close a top opening of the chamber body 12.

The upper electrode 30 may include a ceiling plate 34 and a holder 36. A bottom surface of the ceiling plate 34 that faces the inner space 12c defines the inner space 12c. The ceiling plate 34 may be formed of a semiconductor or a low-resistance conductor with low Joule heating. The ceiling plate 34 has multiple gas injection holes 34a formed therethrough in a thickness direction of the ceiling plate 34.

The holder 36 detachably holds the ceiling plate 34. The holder 36 may be formed of a conductive material such as aluminum. A gas diffusion space 36a is formed in the holder 36. Multiple gas holes 36b are formed in the holder 36. The gas holes 36b extend downward from the gas diffusion space 36a. The gas holes 36b communicate with the gas injection holes 34a, respectively. The holder 36 has a gas inlet port 36c. The gas inlet port 36c is connected to the gas diffusion space 36a. A gas supply line 38 is connected to the gas inlet port 36c.

The gas supply line 38 is connected to a valve group (VG) 44, a flow rate controller group (FRCG) 42, and a gas source group (GSG) 40. The gas source group 40, the valve group 44, and the flow rate controller group 42 constitute a gas supply unit. The gas source group 40 includes multiple gas sources. The valve group 44 includes multiple opening/closing valves. The flow rate controller group 42 includes multiple flow rate controllers. Each of the flow rate controllers of the flow rate controller group 42 is a mass flow controller or a pressure control type flow rate controller. Each of the gas sources of the gas source group is connected to the gas supply line 38 through the corresponding opening/closing valve of the valve group 44 and the corresponding flow rate controller of the flow rate controller group 42.

A baffle plate 48 is disposed between the tubular portion 28 and the sidewall of the chamber body 12. The baffle plate 48 is formed by coating a corrosion resistant film (film made of yttrium oxide or the like) on a surface of an aluminum base, for example. The baffle plate 48 has multiple through-holes. At the bottom portion of the chamber body 12, a gas exhaust port is disposed below the baffle plate 48. A gas exhaust unit (GEU) 50 is connected to the gas exhaust port through a gas exhaust line 52. The gas exhaust unit 50 includes a pressure control valve and a vacuum pump such as a turbo molecular pump.

The plasma processing apparatus 1 further includes a first radio frequency (RF) power supply 62 and a second radio frequency (RF) power supply 64. The first RF power supply 62 is configured to generate a first RF power. The first RF power has a frequency suitable for plasma generation. The frequency of the first RF power is within a range of, e.g., MHz to 100 MHz. The first RF power supply 62 is electrically coupled to the base 18 through a matching unit (MU) 66 and the electrode plate 21. The matching unit 66 has a matching circuit configured to match an output impedance of the first RF power supply 62 and an impedance of a load side (the base 18 side). Alternatively, the first RF power supply 62 may be electrically coupled to the upper electrode 30 through the matching unit 66.

The second RF power supply 64 is configured to generate a second RF power. The second RF power has a frequency lower than the frequency of the first RF power. In the case of using both of the first RF power and the second RF power, the second RF power is used as a bias RF power for attracting ions to the substrate W. The frequency of the second RF power is within a range of, e.g., 400 kHz to 13.56 MHz. The second RF power supply 64 is electrically coupled to the base 18 through a matching unit (MU) 68 and the electrode plate 21. The matching unit 68 has a matching circuit configured to match an output impedance of the second RF power supply 64 and the impedance of the load side (the base 18 side).

The plasma may be generated by using the second RF power alone without using the first RF power. In other words, the plasma may be generated by using a single RF power. In this case, the frequency of the second RF power may be higher than 13.56 MHz and may be e.g., 40 MHz. Further, the plasma processing apparatus 1 may not include the first RF power supply 62 and the matching unit 66.

In the plasma processing apparatus 1, the plasma is generated by supplying a gas from the gas supply unit to the inner space 12c. By supplying at least one of the first RF power and the second RF power, RF electric field is generated between the upper electrode 30 and the base 18 (the lower electrode). The plasma is generated by the RF electric field thus generated.

The plasma processing apparatus 1 may further include a controller MC. The controller MC may be a computer including a processor, a storage device such as a memory, an input device, a display device, a signal input/output interface, and the like. The controller MC is configured to control the individual components of the plasma processing apparatus 1.

The controller MC allows an operator to input commands to manage the plasma processing apparatus 1 through the input device. Further, the controller MC allows the display device to visualize and display an operation status of the plasma processing apparatus 1. Further, a control program and recipe data are stored in the storage device. The control program is executed by the processor to perform various processes in the plasma processing apparatus 1. The processor executes the control program and controls the individual components of the plasma processing apparatus 1 based on the recipe data.

Figure 2:
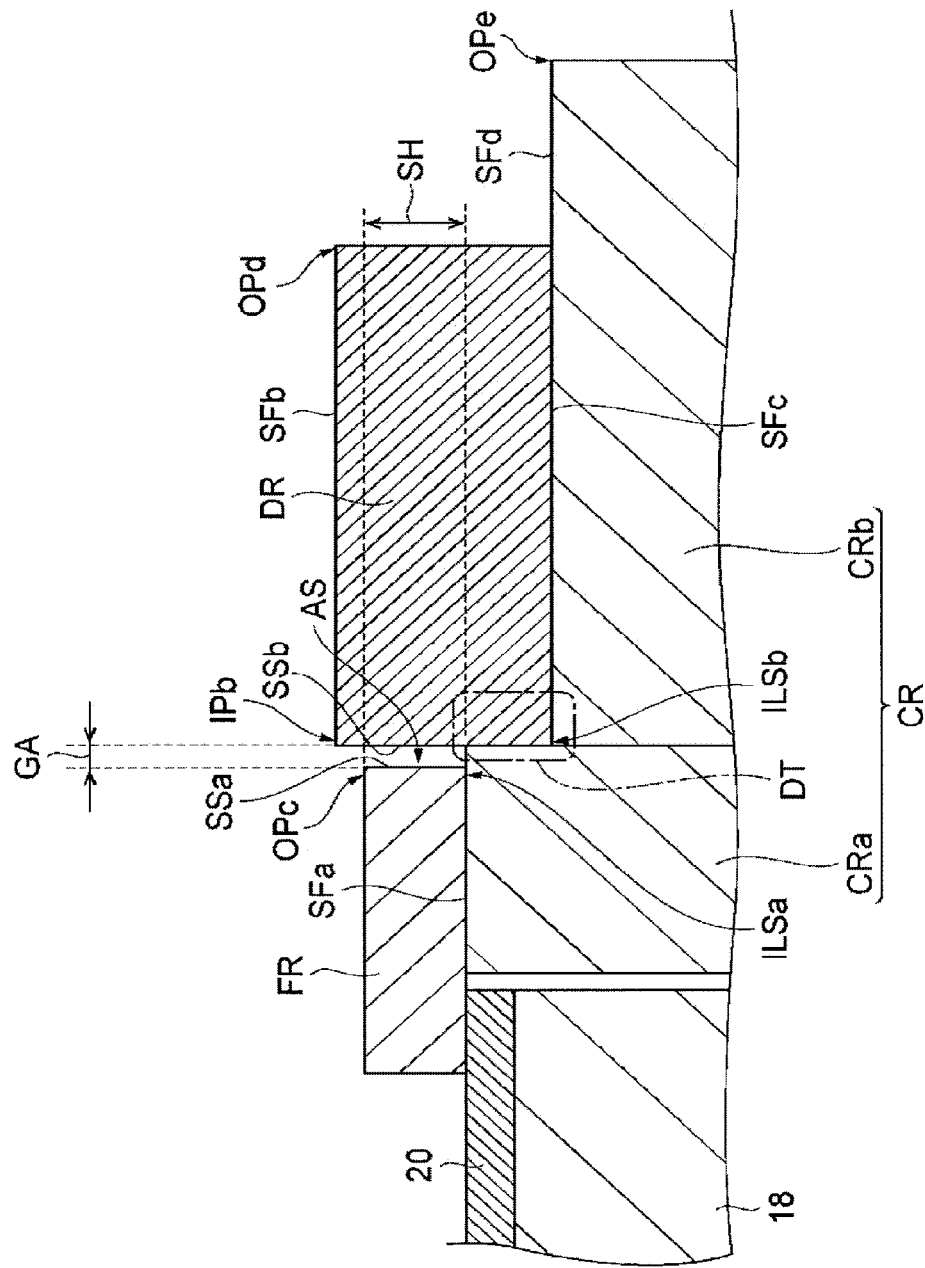
FIG. 2 shows an example of a structure of a conductive ring according to an exemplary embodiment.

With reference to FIG. 2, a structure in a region ER of the substrate support 16 shown in FIG. 1 will be described. Particularly, structures of the conductive ring DR and the focus ring FR will be described in detail.

In the example shown in FIG. 2, the cover ring CR includes two dielectric members, i.e., an inner cover ring CRa and an outer cover ring CRb. The cover ring CR may be formed of one dielectric member or may include three or more dielectric members.

Figure 3:
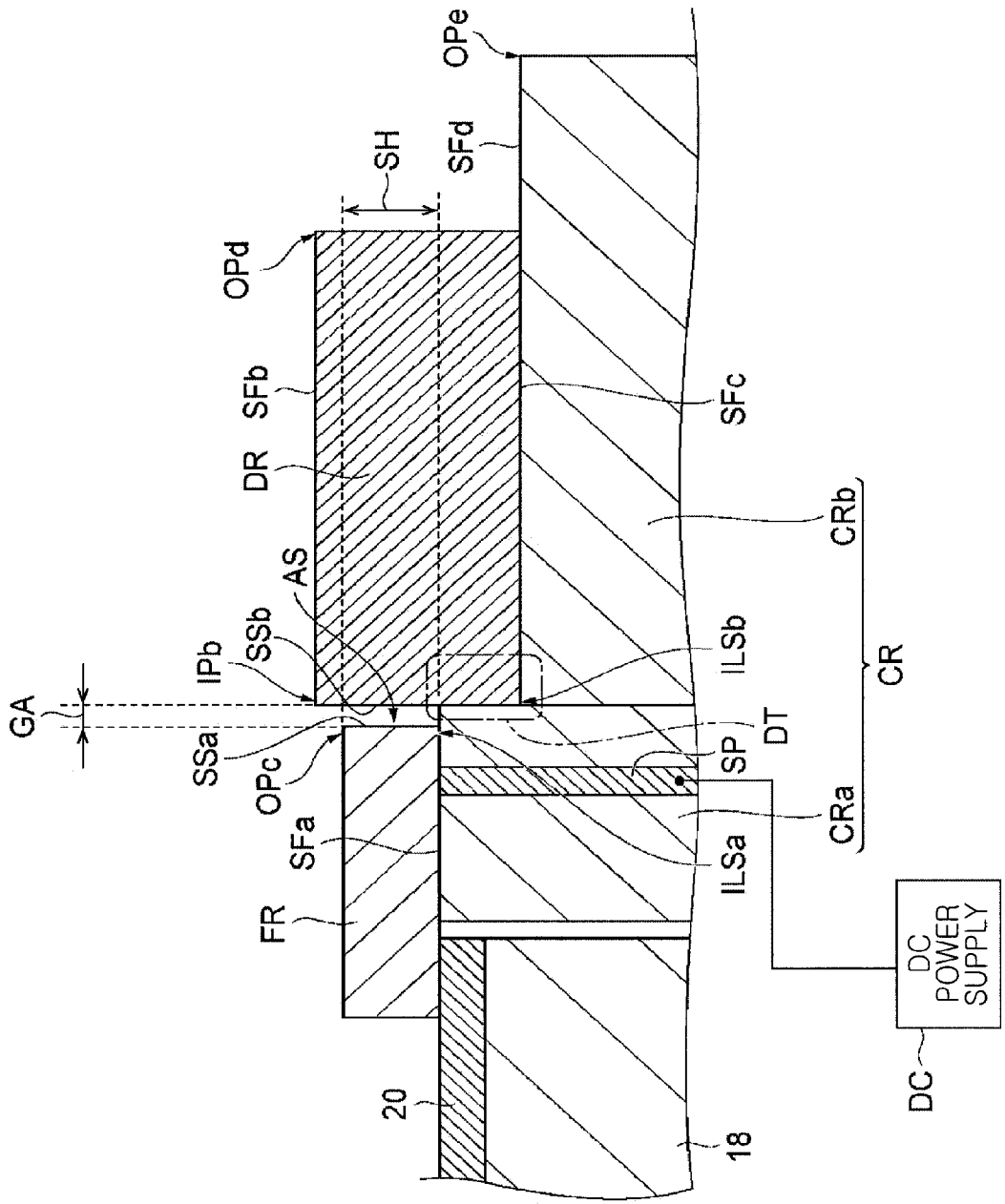
FIG. 3 shows another example of the structure of the conductive ring according to the exemplary embodiment.

An inner peripheral side (inner peripheral portion) of the focus ring FR is placed on the electrostatic chuck 20 that is the peripheral portion 31b of the supporting portion 31, and an outer peripheral side (outer peripheral portion) of the focus ring FR is disposed to cover the inner cover ring CRa. Alternatively, the outer peripheral portion of the focus ring FR may be placed on the inner cover ring CRa. Further, in order to securely support the inner peripheral portion of the focus ring FR by the peripheral portion 31b, a gap may be formed between a bottom surface of the outer peripheral portion of the focus ring FR and the upper surface SFa of the inner cover ring CRa by forming an upper surface SFa of the inner cover ring CRa to be lower than an upper surface of the peripheral portion 31b. In other words, the outer peripheral portion of the focus ring FR may not be placed on the inner cover ring CRa. A thickness of the main body of the electrostatic chuck 20 is very small compared to a thickness of the inner cover ring CRa. Therefore, the focus ring FR is electrically coupled as a RF circuit to the first RF power supply 62 and the second RF power supply 64 through the electrostatic chuck 20. Further, as shown in FIG. 3, a power supply rod SP that is connected to the DC power supply DC and is in contact with the bottom surface of the focus ring FR may be disposed in a through-hole formed through the inner cover ring CRa so that a DC voltage can be applied to the focus ring FR.

The conductive ring DR is placed on the outer cover ring CRb. Since the outer cover ring CRb has a large thickness, the conductive ring DR is not electrically coupled as a RF circuit to the first RF power supply 62 and the second RF power supply 64 through the outer cover ring CRb.

The outer cover ring CRb has an inner peripheral upper surface SFc and an outer peripheral upper surface SFd. The inner peripheral side of the outer cover ring CRb is closer to the focus ring FR, and thus is more easily consumed compared to the outer peripheral side of the outer cover ring CRb. Therefore, in the example of FIG. 2, the conductive ring DR is disposed to cover only a portion that is easily consumed (the inner peripheral upper surface SFc of the outer cover ring CRb). In other words, an outer periphery OPd of the conductive ring DR is located on the inner side compared to an outer periphery OPe of the cover ring CR, and an outer peripheral upper surface SFd of the cover ring CR is exposed to a plasma processing space (the inner space 12c). However, the conductive ring DR may be disposed to cover the entire upper surface of the outer cover ring CRb. Further, in the example of FIG. 2, the outer peripheral upper surface SFd and the inner peripheral upper surface SFc covered with the conductive ring DR are located on the same plane. However, they may not be located on the same plane. For example, the height of the upper surface SFd of the outer cover ring CRb that is not covered with the conductive ring DR may be higher than or equal to the height of an upper surface SFb of the conductive ring DR.

As shown in FIG. 2, a gap AS is formed between the focus ring FR and the conductive ring DR. More specifically, a first side surface SSa on the outer periphery OPc of the focus ring FR and a second side surface SSb on an inner periphery IPb of the conductive ring DR are spaced apart from each other while facing each other. An inner peripheral bottom surface ILSb of the conductive ring DR is disposed below an outer peripheral bottom surface ILSa of the focus ring FR.

In the example shown in FIG. 2, an area of the second side surface SSb is smaller than an area of the upper surface SFb of the conductive ring DR. The upper surface SFb of the conductive ring DR is higher than the upper surface of the focus ring FR. In other words, a thickness of the inner periphery IPb of the conductive ring DR is greater than a thickness of the outer periphery OPc of the focus ring FR.

A distance GA between the first side surface SSa and the second side surface SSb is a width of the gap AS. As will be described later, the first side surface SSa and the second side surface SSb function as a capacitor. Therefore, the distance GA is preferably greater than zero and smaller than a thickness SH of the focus ring FR.

The cover ring CR further includes a spacing portion DT. The spacing portion DT separates the first side surface SSa of the focus ring FR from the second side surface SSb of the conductive ring DR.

In the example shown in FIG. 2, the inner peripheral upper surface SFc of the outer cover ring CRb is lower than the inner peripheral upper surface SFa of the inner cover ring CRa, so that the spacing portion DT that is a stepped portion is formed between the inner cover ring CRa and the outer cover ring CRb. Since the stepped portion is in contact with the second side surface SSb of the conductive ring DR, the second side surface SSb of the conductive ring DR is not in contact with the first side surface SSa of the focus ring FR. In other words, due to the spacing portion DT, it is possible to prevent the first side surface SSa and the second side surface SSb from being in contact with each other so as not to function as the capacitor.

In the substrate support 16 configured as described above, the conductive ring DR is disposed on the cover ring CR. Further, since the thickness of the cover ring CR is greater than the thickness of the main body of the electrostatic chuck 20, the conductive ring DR is not electrically coupled as a RF circuit to the first RF power supply 62 and the second RF power supply 64 through the cover ring CR. Further, the first side surface SSa of the outer periphery OPc of the focus ring FR and the second side surface SSb of the inner periphery IPb of the conductive ring DR are spaced apart from each other while facing each other. Therefore, the first side surface SSa and the second side surface SSb function as the capacitor. In other words, the focus ring FR and the conductive ring DR are capacitively coupled between the first side surface SSa and the second side surface SSb. When the RF power is applied to the base 18, positive or negative charges existing on the first side surface SSa of the outer periphery OPc of the focus ring FR cause electrostatic induction in the conductive ring DR. Accordingly, charges whose amount is the same as that of charges collected on the second side surface SSb of the conductive ring DR and whose polarity is opposite to that of the charges collected on the second side surface SSb of the conductive ring DR are attracted by the potential of the plasma and collected on the upper surface SFb of the conductive ring DR. Since the area of the upper surface SFb is greater than the area of the second side surface SSb, the amount of charges per unit area on the upper surface SFb is smaller than that on the second side surface SSb. Therefore, the potential of the conductive ring DR becomes lower than the potential of the focus ring FR, and acceleration of ions in the plasma toward the conductive ring DR is suppressed. Accordingly, the conductive ring DR (i.e., the outer region of the focus ring FR) is less likely to be sputtered.

The conductive ring DR is disposed to cover a portion of the cover ring CR that is easily consumed and is made of a material having higher resistance to the sputtering compared to the resistance of the cover ring CR. Further, since the acceleration of ions toward the conductive ring DR is suppressed, the conductive ring DR itself is also less likely to be sputtered. Therefore, it is possible to suppress the area variation of the focus ring FR serving as the cathode due to the consumption of the cover ring CR near the outer periphery of the focus ring FR. Accordingly, it is possible to suppress process variation such as occurrence of tilting at the edge of the substrate and the like.

Further, by adjusting the area of the upper surface SFb of the conductive ring DR, the potential of the upper surface SFb of the conductive ring DR can be adjusted.

In addition, the conductive ring DR is disposed to face the first side surface SSa of the focus ring FR. Since an object (conductive ring DR) is disposed at the side of the first side surface SSa of the focus ring FR, ions moving toward the first side surface SSa are blocked by the conductive ring DR. Therefore, the focus ring FR is less likely to be sputtered from the first side surface SSa, which makes it possible to suppress the consumption of the focus ring FR.

Figure 4:
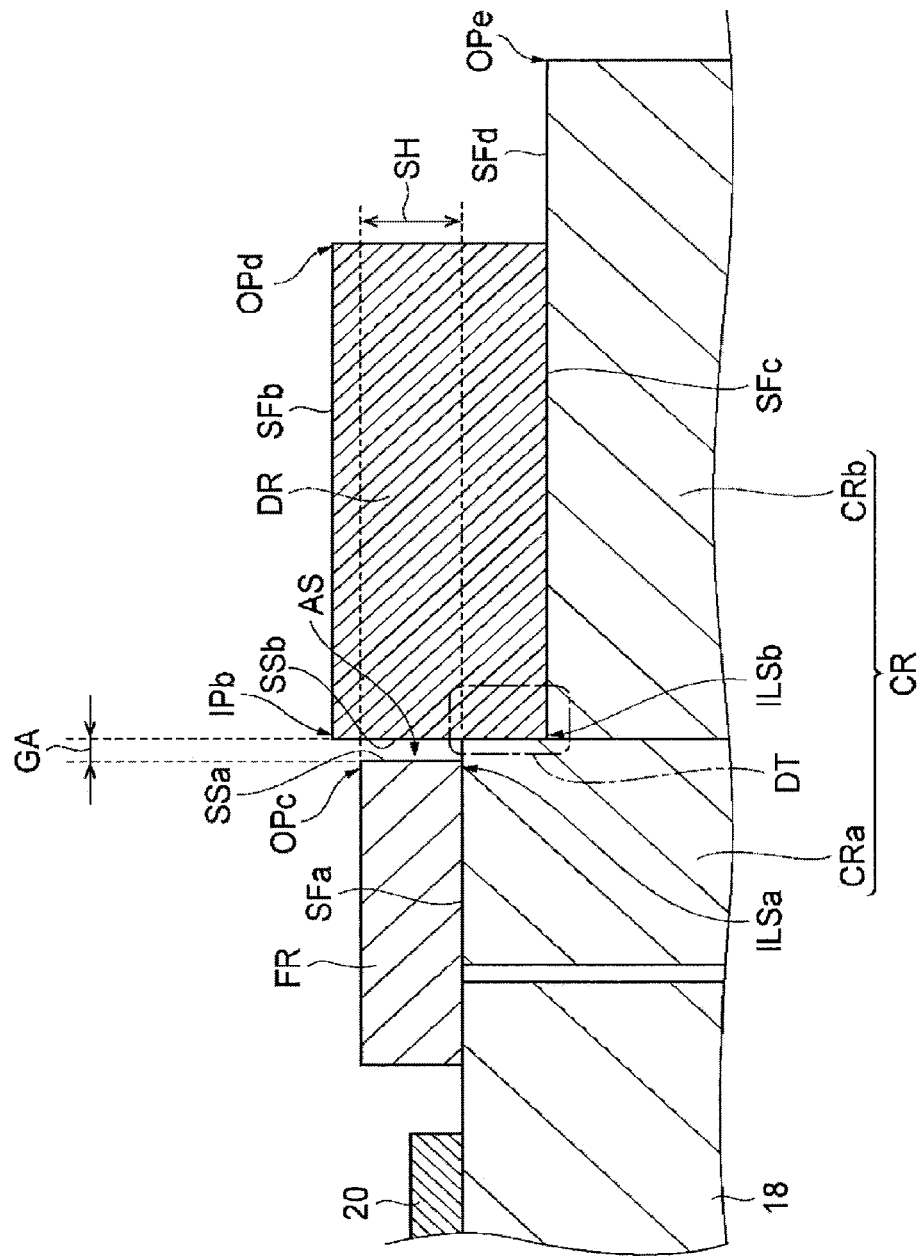
FIG. 4 shows still another example of the structure of the conductive ring according to the exemplary embodiment.

In the example shown in FIG. 2, the substrate supporting portion 31a and the peripheral portion 31b on which the focus ring FR is placed serve as the electrostatic chuck 20. However, the present disclosure is not limited thereto. An electrostatic chuck that is the substrate supporting portion 31a and an electrostatic chuck that is the peripheral portion 31b may be separately provided. Alternatively, as shown in FIG. 4, only the substrate supporting portion 31a may be configured as the electrostatic chuck 20, and the peripheral portion 31b may be configured as the base 18. Further, the entire focus ring including the inner peripheral side of the focus ring FR may be placed on the peripheral portion 31b. The peripheral portion 31b may be formed lower than the substrate supporting portion 31a so that a stepped portion can be formed.

Figure 5:
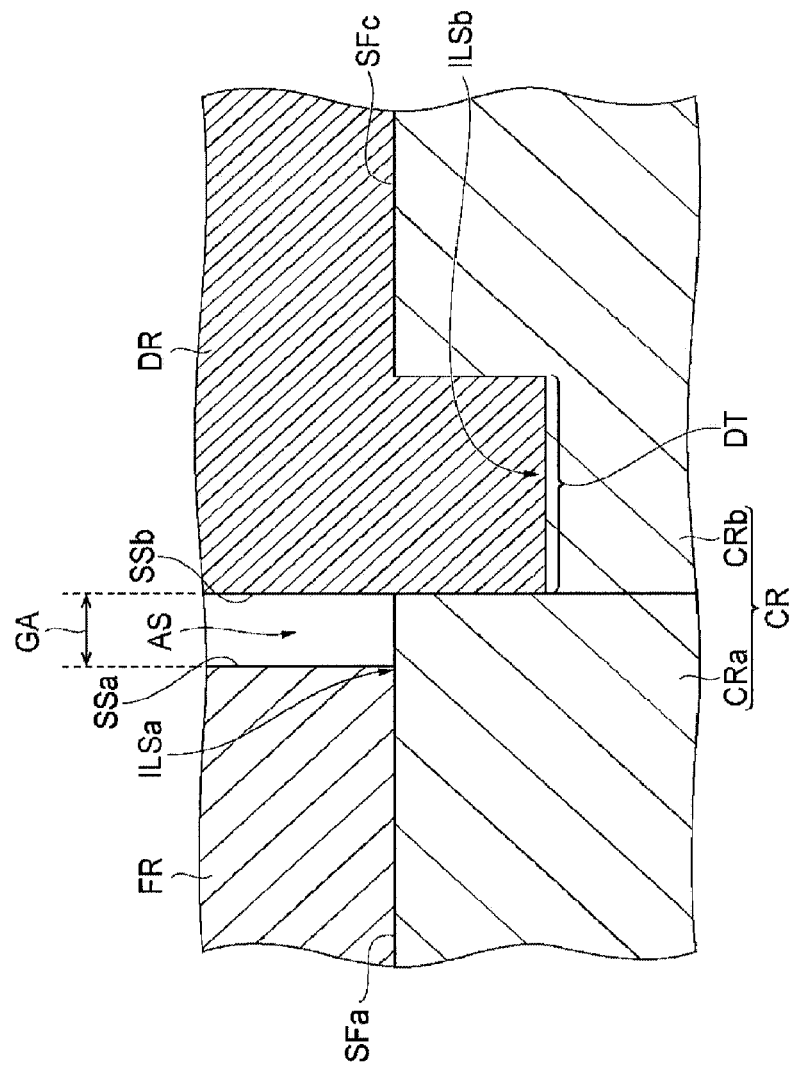
FIG. 5 shows variation of a structure of an inner peripheral bottom surface of the conductive ring and a structure of a spacing portion.

Further, in the example shown in FIG. 2, the inner peripheral upper surface SFc of the outer cover ring CRb is lower than the upper surface SFa of the inner cover ring CRa, so that the spacing portion DT is formed. However, the present disclosure is not limited thereto. As shown in FIG. 5, a concave groove may be formed at a portion of the cover ring CR on which the conductive ring DR is placed, and an inner peripheral bottom surface ILSb of the conductive ring DR may extend downwardly (convex shape). In this case, the inner peripheral bottom surface ILSb of the conductive ring DR is fitted in the groove of the cover ring CR. By fitting the convex inner peripheral bottom surface ILSb into the concave groove, the position of the conductive ring DR in the cover ring CR can be stably maintained. Although the groove is formed as the spacing portion DT at the outer cover ring CRb in FIG. 5, the groove may be formed at the inner cover ring CRa. In this case, the inner peripheral portion of the conductive ring DR is placed on the inner cover ring CRa, and the outer peripheral portion of the conductive ring DR is placed on the outer cover ring CRb. In FIG. 5, the upper surface SFa of the cover ring CR on which the focus ring FR is placed and the upper surface SFc of the cover ring CR on which the conductive ring DR is placed have the same height. However, the upper surface SFa and the upper surface SFC may have different heights. For example, the upper surface SFc of the cover ring CR on which the conductive ring DR is placed may be higher than the upper surface SFa of the cover ring CR on which the focus ring FR is placed.

Figure 6:
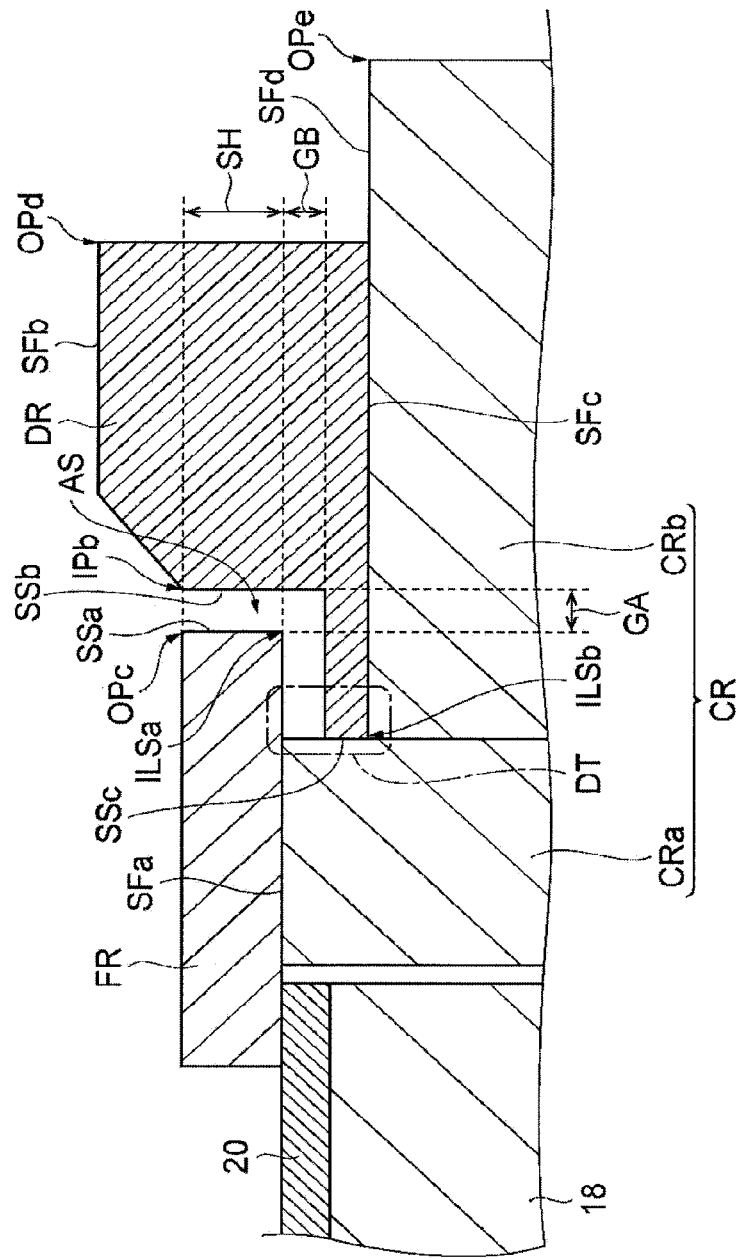
FIG. 6 shows further still another example of the structure of the conductive ring according to the exemplary embodiment.

Further, in the example shown in FIG. 2, the first side surface SSa of the focus ring FR and the second side surface SSb of the conductive ring DR are spaced apart from each other while facing each other to function as the capacitor. However, the present disclosure is not limited thereto. As shown in FIG. 6, an outer peripheral bottom surface of the focus ring FR and an inner peripheral upper surface of the conductive ring DR may be spaced apart from each other while facing each other. In FIG. 6, a lower inner peripheral portion of the conductive ring DR protrudes toward the inner peripheral side. The upper surface of the protruding lower inner peripheral portion of the conductive ring DR and the bottom surface of the focus ring FR are spaced apart from each other while facing each other. Further, the first side surface SSa of the focus ring FR and the second side surface SSb that is a side surface of an upper inner peripheral portion of the conductive ring DR are spaced apart from each other while facing each other.

The inner peripheral upper surface SFc of the outer cover ring CRb is lower than the upper surface SFa of the inner cover ring CRa, and the spacing portion DT that is a stepped portion is formed between the inner cover ring CRa and the outer cover ring CRb. Since a third side surface SSc that is a side surface of the lower inner peripheral portion of the conductive ring DR is in contact with the stepped portion (the outer peripheral side surface of the inner cover ring CRa), the second side surface SSb that is the side surface of the upper inner peripheral portion of the conductive ring DR is not in contact with the first side surface SSa of the focus ring FR. The upper surface SFa of the inner cover ring CRa is higher than the upper surface of the lower inner peripheral portion of the conductive ring DR. Therefore, the bottom surface of the focus ring FR is in contact with the upper surface SFa of the inner cover ring CRa, and the upper surface of the lower inner peripheral portion of the conductive ring DR is not in contact with the bottom surface of the focus ring.

In the example shown in FIG. 6, not only the first side surface SSa and the second side surface SSb but also the outer peripheral bottom surface of the focus ring FR and the upper surface of the lower inner peripheral portion of the conductive ring DR can function as the capacitor. Accordingly, the capacitance between the focus ring FR and the conductive ring DR can be increased.

A distance GB between the outer peripheral bottom surface of the focus ring FR and the upper surface of the lower inner peripheral portion of the conductive ring DR may be smaller than the distance GA between the first side surface SSa and the second side surface SSb. Since the distance GB is smaller than the distance GA, the capacitance between the outer peripheral bottom surface of the focus ring FR and the upper surface of the lower inner peripheral portion of the conductive ring DR becomes greater than the capacitance between the first side surface SSa and the second side surface SSb. Therefore, even if the areas of the first side surface SSa and the second side surface SSb are changed due to the consumption of the focus ring FR and the conductive ring DR, the capacitance variation between the focus ring FR and the conductive ring DR can be reduced. Further, since the distance GA between the first side surface SSa and the second side surface SSb can be increased, it is possible to prevent the gap AS from being closed (filled) by deposits and becoming unable to function as the capacitor or having large variation in capacitance.

An area of the upper surface of the lower inner peripheral portion of the conductive ring DR facing the outer peripheral bottom surface of the focus ring FR may be greater than an area of the inner peripheral side surface of the conductive ring DR facing the outer peripheral side surface of the focus ring FR. In this case, since the capacitance between the outer peripheral bottom surface of the focus ring FR and the upper surface of the lower inner peripheral portion of the conductive ring DR increases, the capacitance variation between the focus ring FR and the conductive ring DR can be reduced.

Further, as illustrated in the example shown in FIG. 6, a sloped portion may be formed between the inner peripheral side surface and the upper surface of the conductive ring DR. Due to the sloped portion, the changes in height between the upper surface of the focus ring FR and the upper surface of the conductive ring DR can be smooth, and discontinuity in the sheath formed above the conductive ring DR and the focus ring FR can be decreased.

In the examples shown in FIGS. 2 to 6, the upper surface SFb of the conductive ring DR is higher than the upper surface of the focus ring FR. However, the present disclosure is not limited thereto. The height of the upper surface SFb of the conductive ring DR may be lower than or equal to that of the upper surface of the focus ring FR.

In the example shown in FIG. 6, the outer peripheral bottom surface of the focus ring FR and the inner peripheral upper surface of the conductive ring DR are spaced apart from each other while facing each other. Alternatively, as shown in FIG. 7, an outer peripheral upper surface of the focus ring FR and an inner peripheral bottom surface of the conductive ring DR may be spaced apart from each other while facing each other.

Figure 7:
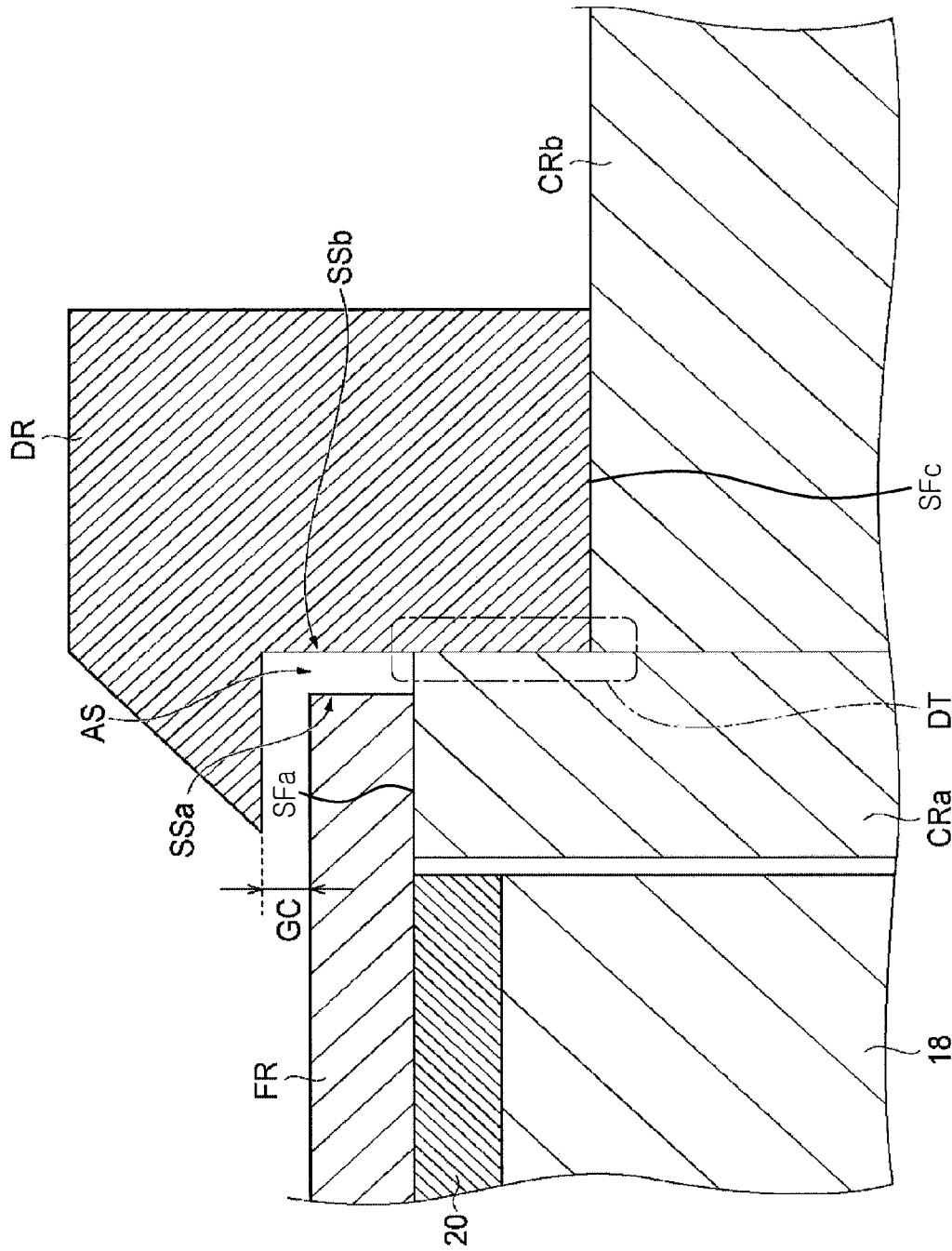
FIG. 7 shows further still another example of the structure of the conductive ring according to the exemplary embodiment.

In the conductive ring DR shown in FIG. 7, an upper inner peripheral portion of the conductive ring DR protrudes toward the inner peripheral side. The bottom surface of the protruding upper inner peripheral portion of the conductive ring DR and the upper surface of the focus ring FR are spaced apart from each other while facing each other. Further, the first side surface SSa of the focus ring FR and the second side surface SSb that is a side surface of a lower inner peripheral portion of the conductive ring DR are spaced apart from each other while facing each other.

The inner peripheral upper surface SFc of the outer cover ring CRb is lower than the upper surface SFa of the inner cover ring CRa, so that the spacing portion DT that is a stepped portion is formed between the inner cover ring CRa and the outer cover ring CRb. Since a portion of the second side surface SSb that is the side surface of the lower inner peripheral portion of the conductive ring DR is in contact with the stepped portion (the outer peripheral side surface of the inner cover ring CRa), a portion of the second side surface SSb that is the side surface of the upper inner peripheral portion of the conductive ring DR is not in contact with the first side surface SSa of the focus ring FR. The bottom surface of the protruding upper inner peripheral portion of the conductive ring CRa is higher than the outer peripheral upper surface of the focus ring FR. Therefore, the bottom surface of the upper inner peripheral portion of the conductive ring DR is not in contact with the upper surface of the focus ring FR.

Similar to the example shown in FIG. 6, a distance GC between the outer peripheral upper surface of the focus ring FR and the bottom surface of the upper inner peripheral portion of the conductive ring DR may be smaller than the distance GA between the first side surface SSa and the second side surface SSb. An area of the bottom surface of the upper inner peripheral portion of the conductive ring DR facing the outer peripheral upper surface of the focus ring FR may be greater than an area of the inner peripheral side surface of the conductive ring DR facing the outer peripheral side surface of the focus ring FR.

In the example shown in FIG. 7, the gap AS is covered by the upper inner peripheral portion of the conductive ring DR, so that it is possible to prevent the gap AS from being closed (filled) by deposits and becoming unable to function as a capacitor or having large variation in capacitance.

In the examples shown in FIGS. 6 and 7, the outer peripheral bottom surface (upper surface) of the focus ring FR and the inner peripheral upper surface (bottom surface) of the conductive ring DR are spaced apart from each other while facing each other, and the first side surface SSa of the focus ring FR and the second side surface SSb of the conductive ring DR are spaced apart from each other while facing each other. However, only the outer peripheral bottom surface (upper surface) of the focus ring FR and the inner peripheral upper surface (bottom surface) of the conductive ring DR may be spaced apart from each other while facing each other.

In the examples shown in FIGS. 2 to 7, the focus ring FR is disposed to cover the inner cover ring CRa on the outer peripheral side (outer peripheral portion) of the focus ring FR. However, the entire focus ring FR may be disposed on the electrostatic chuck 20 or on the base 18. In other words, not only the inner peripheral side (inner peripheral portion) of the focus ring FR but also the outer peripheral side (outer peripheral portion) of the focus ring FR may be placed on the base 18 or the electrostatic chuck 20 that is the peripheral portion 31b of the supporting portion 31.

Figure 8:
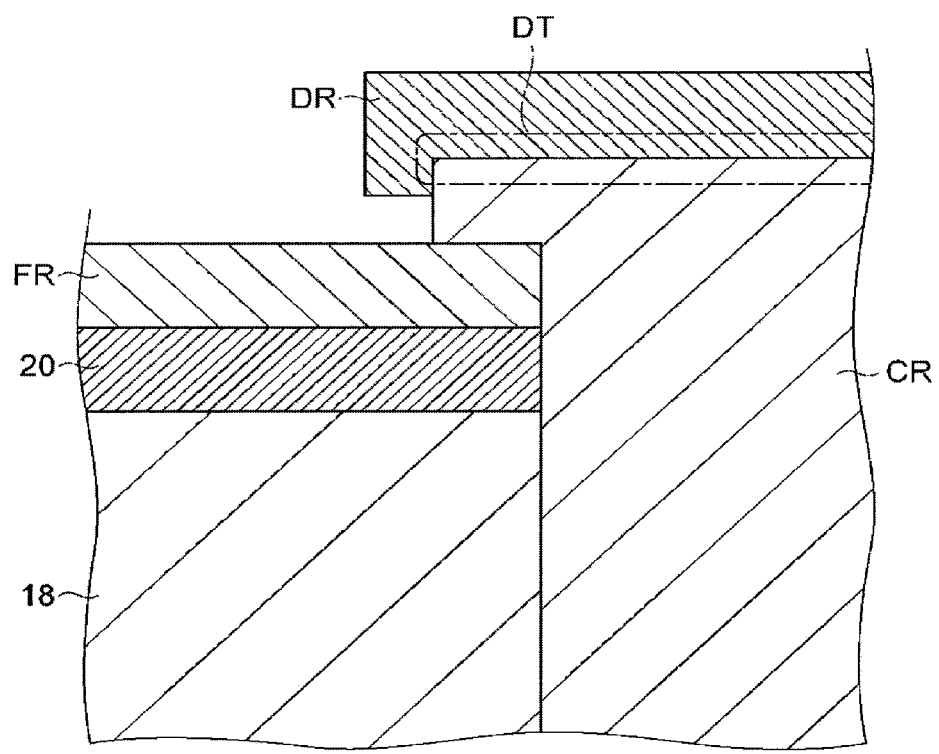
FIG. 8 shows further still another example of the structure of the conductive ring according to the exemplary embodiment.

FIG. 8 shows an example in which only the outer peripheral upper surface of the focus ring FR and the inner peripheral bottom surface of the conductive ring DR are spaced apart from each other while facing each other. Further, the entire focus ring FR is placed on the electrostatic chuck 20.

The inner peripheral portion of the cover ring CR is placed on the outer peripheral portion of the focus ring FR. The conductive ring DR is placed on the cover ring CR. The inner peripheral portion of the conductive ring DR has a downwardly protruding portion. A bottom surface of the protruding portion (inner peripheral bottom surface) of the conductive ring DR and the outer peripheral upper surface of the focus ring FR are spaced apart from each other while facing each other. Since the conductive ring DR is placed on the cover ring CR, the upper surface of the cover ring CR and the outer peripheral bottom surface of the conductive ring DR are in contact with each other. In other words, the upper surface of the cover ring CR serves as the spacing portion DT, and the bottom surface of the protruding portion of the conductive ring DR and the outer peripheral upper surface of the focus ring FR are not in contact with each other. Although the downwardly protruding portion is formed at the inner peripheral portion of the conductive ring DR in the example shown in FIG. 8, the protruding portion may not be formed as long as a sufficient capacitance can be obtained between the inner peripheral bottom surface of the conductive ring DR and the outer peripheral upper surface of the focus ring.

While various embodiments have been described above, various omissions, substitutions, and changes may be made without being limited to the above-described embodiments. Further, other embodiments can be implemented by combining elements in different embodiments.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing apparatus comprising:
a plasma processing chamber;
a substrate support disposed in the plasma processing chamber, the substrate support including a base and an electrostatic chuck disposed on the base;
at least one insulating ring disposed so as to surround the substrate support;
an inner conductive ring disposed on the electrostatic chuck and the at least one insulating ring so as to surround a substrate on the electrostatic chuck, the inner conductive ring having an outer side surface;
an outer conductive ring disposed on the at least one insulating ring so as to surround the inner conductive ring without contacting the inner conductive ring, the outer conductive ring having an inner side surface facing the outer side surface of the inner conductive ring;
a radio frequency power supply electrically coupled to the substrate support.

2. The plasma processing apparatus of claim 1, wherein:
the at least one insulating ring includes a first insulating ring and a second insulating ring surrounding the first insulating ring;
the inner conductive ring is disposed on the first insulating ring; and
the outer conductive ring is disposed on the second insulating ring.

3. The plasma processing apparatus of claim 2, wherein:
an upper surface of the first insulating ring has a first inner region and a first outer region;
the inner conductive ring is disposed on the first inner region; and
the first outer region is exposed to a space between the outer side surface of the inner conductive ring and the inner side surface of the outer conductive ring.

4. The plasma processing apparatus of claim 3, wherein:
an upper surface of the second insulating ring has a second inner region and a second outer region;
the outer conductive ring is disposed on the second inner region; and
the second outer region is exposed to a plasma processing space of the plasma processing chamber.

5. The plasma processing apparatus of claim 4, wherein an upper surface of the outer conductive ring is higher than an upper surface of the inner conductive ring.

6. The plasma processing apparatus of claim 5, wherein the outer conductive ring has a sloped surface between the inner side surface and the upper surface of the outer conductive ring.

7. The plasma processing apparatus of claim 2, wherein:
an upper surface of the second insulating ring has a second inner region and a second outer region;
the outer conductive ring is disposed on the second inner region; and
the second outer region is exposed to a plasma processing space of the plasma processing chamber.

8. The plasma processing apparatus of claim 1, wherein an upper surface of the outer conductive ring is higher than an upper surface of the inner conductive ring.

9. The plasma processing apparatus of claim 8, wherein the outer conductive ring has a sloped surface between the inner side surface and the upper surface of the outer conductive ring.

10. The plasma processing apparatus of claim 1, wherein the inner conductive ring and the outer conductive ring are capacitively coupled between the outer side surface of the inner conductive ring and the inner side surface of the outer conductive ring.

11. The plasma processing apparatus of claim 1, wherein a distance between the outer side surface of the inner conductive ring and the inner side surface of the outer conductive ring is greater than zero and smaller than a thickness of the inner conductive ring.

12. The plasma processing apparatus of claim 1, wherein a bottom surface of the outer conductive ring is lower than a bottom surface of the inner conductive ring.

13. The plasma processing apparatus of claim 1, wherein the inner conductive ring is formed of silicon or silicon carbide.

14. The plasma processing apparatus of claim 13, wherein the outer conductive ring is formed of silicon or silicon carbide.

15. The plasma processing apparatus of claim 14, wherein the at least one insulating ring is formed of quartz.

16. A substrate support assembly for use in a plasma processing apparatus, comprising:
a substrate support;
at least one insulating ring disposed so as to surround the substrate support;
an inner conductive ring disposed on at least one of the substrate support and the at least one insulating ring so as to surround a substrate on the substrate support, the inner conductive ring having an outer side surface; and
an outer conductive ring disposed on the at least one insulating ring so as to surround the inner conductive ring without contacting the inner conductive ring, the outer conductive ring having an inner side surface facing the outer side surface of the inner conductive ring.

17. The substrate support assembly of claim 16, wherein an upper surface of the outer conductive ring is higher than an upper surface of the inner conductive ring.

18. The substrate support assembly of claim 17, wherein the outer conductive ring has a sloped surface between the inner side surface and the upper surface of the outer conductive ring.

19. The substrate support assembly of claim 16, wherein the inner conductive ring and the outer conductive ring are capacitively coupled between the outer side surface of the inner conductive ring and the inner side surface of the outer conductive ring.

20. The substrate support assembly of claim 16, wherein a distance between the outer side surface of the inner conductive ring and the inner side surface of the outer conductive ring is greater than zero and smaller than a thickness of the inner conductive ring.

\* \* \* \* \*